United States Patent [19]
Burri

[11] Patent Number: 5,392,418
[45] Date of Patent: Feb. 21, 1995

[54] PROGRAMMABLE READ ONLY MEMORY WITH OUTPUT INDICATING PROGRAMMING STATE

[75] Inventor: Michel Burri, Gd Saconnex, Switzerland

[73] Assignee: Motorola, Inc., Schaumburg, Ill.

[21] Appl. No.: 837,189

[22] Filed: Feb. 14, 1992

[30] Foreign Application Priority Data

Mar. 6, 1991 [GB] United Kingdom ............... 9104743

[51] Int. Cl.$^6$ .................................................. G11C 17/16
[52] U.S. Cl. ....................................... 395/425; 365/96; 365/104; 365/105
[58] Field of Search .................. 395/400, 425; 365/96, 365/104, 105

[56] References Cited

U.S. PATENT DOCUMENTS

| | | | |
|---|---|---|---|
| 3,810,127 | 5/1974 | Hoff, Jr. | 365/96 |
| 4,312,046 | 1/1982 | Taylor | 365/104 |
| 4,609,998 | 9/1986 | Bosnyak et al. | 365/96 |
| 4,686,384 | 8/1987 | Harvey et al. | 307/202.1 |
| 4,757,359 | 7/1988 | Chiao et al. | 357/23.5 |
| 4,882,666 | 11/1989 | Brunning et al. | 363/97 |
| 4,935,645 | 6/1990 | Lee | 307/362 |

Primary Examiner—Jack B. Harvey
Assistant Examiner—Michael H. Tall
Attorney, Agent, or Firm—Rennie William Dover

[57] ABSTRACT

A non-volatile memory cell including a pn diode and a circuit for sensing the logic state of the pn diode such that a logic one state indicates that the diode is in its normal state, while the other logic state is created by fusing the diode for creating a short circuit. The circuit for sensing the logic state of the diode includes a circuit for developing a sense voltage across the diode, a first comparator for comparing the sense voltage with a first reference voltage greater than the normal junction voltage, a second comparator for comparing the sense voltage with a second reference voltage less than the normal junction voltage but greater than the fused junction voltage and a circuit responsive to the outputs of the first and second comparators to provide an output signal which has a first value if the sense voltage is between the first and second reference voltages and a second value if the sense voltage is not between the first and second reference voltages.

9 Claims, 1 Drawing Sheet

PROGRAMMABLE READ ONLY MEMORY WITH OUTPUT INDICATING PROGRAMMING STATE

FIELD OF THE INVENTION

This invention relates to a non-volatile (programmable) read only memory for use in automotive applications.

BACKGROUND ART

A variety of programmable read only memories are known. Some contain a fusible link which is blown by a high current pulse or irradiation by ultra violet light. Other types contain floating gates wherein a charge is placed on the gate by applying a high voltage, say about 25 volts. Another method is to apply a high reverse voltage to a Zener diode, much higher than its normal breakdown voltage in order to cause the diode to go open circuit.

A problem with all the above types of programmable memory is that they are not suitable for automotive applications wherein in situ programming of the elements is required using only the 12 volt battery power source; furthermore fusible link type memories are not always reliable.

It has been proposed to provide a pn diode junction with a metallic layer nearby whereby the diode in its normal state represents one logic state and the other logic state is created by subjecting the diode to a low voltage current pulse in a forward bias direction which is sufficient to fuse the junction by causing migration of metal ions or atoms into the diode junction region.

A problem with such an arrangement is that said current pulse may destroy the electrical continuity of said metallic layer, resulting in an open circuit. In addition, further metal migration during the lifetime of an otherwise correctly programmed diode junction may destroy electrical continuity.

SUMMARY OF THE INVENTION

It is an object of the present invention to overcome the above problems.

The present invention provides a non-volatile memory cell including a pn diode whereby the diode in its normal state represents one logic state and the other logic state is created by fusing the diode for creating a short circuit, and means for sensing the logic state of the diode, comprising means for developing a sense voltage across the diode,
a first comparator means for comparing the sense voltage with a first reference voltage greater than the normal junction voltage, a second comparator means for comparing the sense voltage with a second reference voltage less than the normal junction voltage but greater than the fused junction voltage and means responsive to the outputs of the first and second comparator means to provide an output signal which has a first value if the sense voltage is between the first and second reference voltages and a second value if the sense voltage is not between the first and second reference voltages.

Thus in accordance with the invention the comparator means provides an EXCLUSIVE OR function such that when the comparator output values are different the output signal has a first value (denoting the diode junction is fused and is short circuit, or electrical continuity has been destroyed and it is open circuit) whereas if the comparator values are the same, the output signal has a second value (denoting the diode junction is in a normal condition)

Hence in accordance with the invention, it is possible to determine the logic state of the memory call, whether the cell is in a first state representing a normal condition of the diode junction or in a second state representing an open or short circuit condition of the diode junction.

BRIEF DESCRIPTION OF THE DRAWINGS

A preferred embodiment of the invention will now be described with reference to the accompanying drawings wherein.

DESCRIPTION OF THE PREFERRED EMBODIMENT

Figure 1:
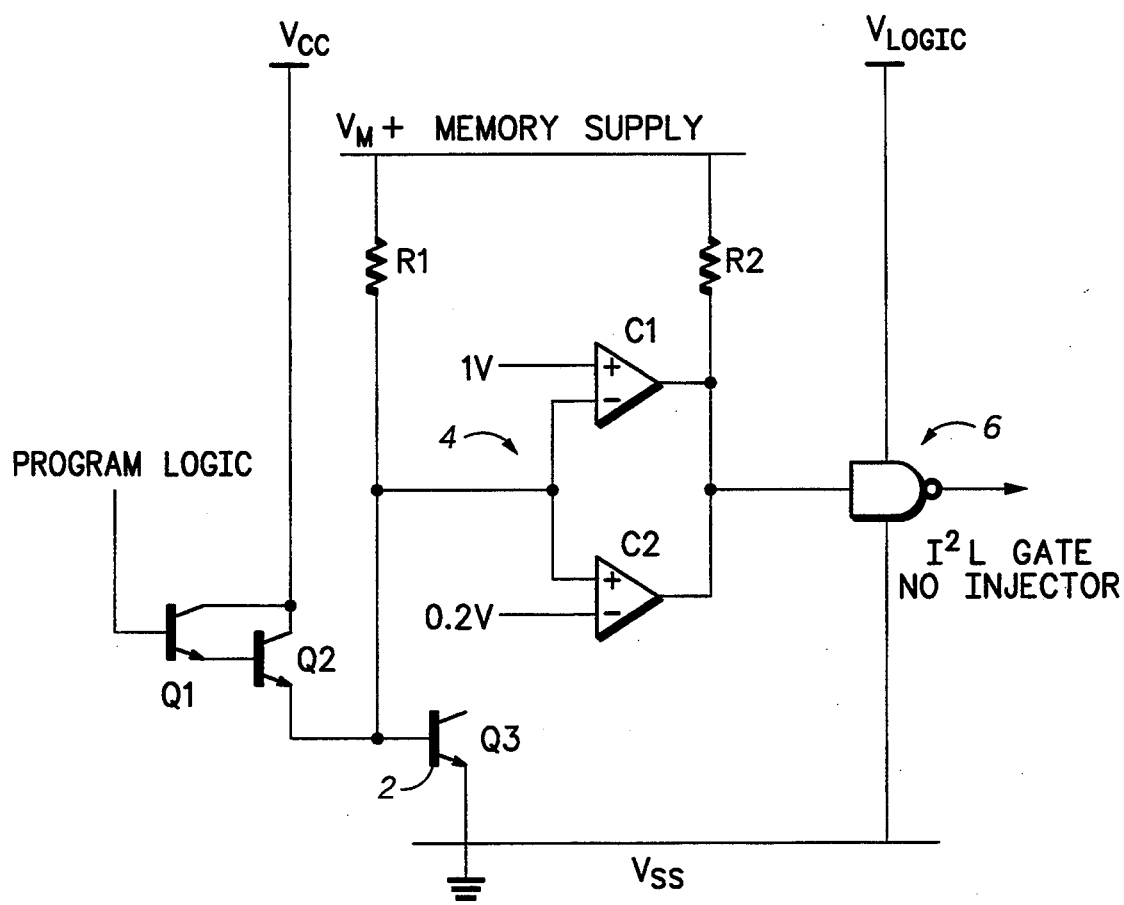
FIG. 1 is a circuit diagram of a memory cell in accordance with the invention.

Referring to FIG. 1 there is shown a memory cell of a programmable read only memory comprising as its central element a base emitter junction 2 of a bipolar transistor Q3. This base emitter junction is of a construction to permit fusing of the junction when a low voltage current pulse is applied thereto such as to change the normal diode junction voltage of 0.7 volts to a low value of 0.1 volts. These two different states represent different logic states of the memory cell.

For programming the junction 2, a Darlington pair of transistors Q1, Q2 is coupled between a supply voltage $V_{cc}$ and the base of junction 2. A program logic signal is applied to the base of transistor Q1 in order to effect programming.

In order to determine the state of the diode junction, a sense circuit 4 is provided comprising a voltage $V_m$ applied via a resistor R1 to diode 2 in order to develop a sense voltage thereacross. This sense voltage is applied to the inverting input of a first operational amplifier or comparator C1 and to the non-inverting input of a second operational amplifier or comparator C2. A reference voltage of 1.0 volts is applied to the non-inverting input of comparator C1 and a reference of 0.2 volts is applied to the inverting input of comparator C2. The outputs of comparators C1 and C2 are connected in common to the input of an inverting I2L gate 6. The input of gate 6 is also coupled by a load resistor R2 to voltage $V_m$. Gate 6 is powered by a supply voltage $V_{LOGIC}$.

Thus in operation, diode 2 may have a normal voltage of 0.7 volts, or if programming has been effected a short circuit voltage of 0.1 volts or, if electrical continuity has been broken, an open circuit voltage which will be equal to $V_m$. In order to sense the logical state of diode 2, if the diode is in its normal state providing a sense voltage of 0.7 volts then both the comparators will provide a positive output. That is to say the output transistors of comparators C1 and C2 will be off giving positive outputs and permitting current injection by a resistance R2 to the input of gate 6, which gate inverts to give a zero volt output.

If diode 2 has been fused by appropriate programming, resulting in a low junction voltage of 0.1 volts or thereabouts, this voltage applied to the inputs of comparators C1, C2 result in comparator C1 remaining high at its output whereas comparator C2 goes low in the sense that its output transistor is turned on resulting in a drain of current from resistor R2 so that no current is injected into gate 6 and the output of gate 6 remains high.

If during the programming of junction 2, the junction goes open circuit, then a voltage $V_m$ is applied to the inputs of comparators C1, C2, resulting in the output of C1 going low whereas the output of C2 is high. Thus the output transistor of C1 is turned on which drains the current from resistor R2 and prevents current injection into gate 6. Thus the out:put of gate 6 remains high.

I claim:

1. A non-volatile memory cell including a pn diode having a pn junction which, in its normal state, represents a first logic state and a second logic state is created by fusing the pn junction of the diode to create a short circuit, and means for sensing the logic state of the diode, said means for sensing comprising:

means for developing a sense voltage across the diode;

a first comparator means for comparing the sense voltage with a first reference voltage greater than a normal voltage across the pn junction;

a second comparator means for comparing the sense voltage with a second reference voltage less than the normal voltage across the pn junction but greater than a voltage across the pn junction when it is fused; and means responsive to outputs of the first and second comparator means to provide an output signal which has a first value if the sense voltage is between the first and second reference voltages and a second value if the sense voltage is not between the first and second reference voltages.

2. A cell as claimed in claim 1, wherein the diode is provided by an emitter of a bipolar transistor.

3. A cell as claimed in claim 1, wherein said means for developing a sense voltage comprises a first resistance coupled between a memory power supply and the diode, the first and second comparator means being coupled to a node between the diode and the first resistance.

4. A cell as claimed in claim 1, wherein the first comparator means comprises a first operational amplifier having a non-inverting input coupled to the first reference voltage and an inverting input connected to the same voltage means.

5. A cell as claimed in claim 1, wherein the second comparator means comprises a second operational amplifier having a non-inverting input connected to the sense voltage means and an inverting input connected to the second reference voltage.

6. A cell as claimed in claim 1, wherein the output of the first and second comparator means are connected in common to an input of an output gate means.

7. A cell as claimed in claim 6, wherein the output gate means comprises an inverting I²L gate.

8. A cell as claimed in claim 6 wherein a load resistance is connected between the outputs of the first and second comparator means and a memory power supply.

9. A cell as claimed in claim 1, including means for programming the diode comprising a Darlington pair of transistors coupled to the diode.

* * * * *